(12) United States Patent
Noh et al.

(10) Patent No.: US 8,008,154 B2
(45) Date of Patent: Aug. 30, 2011

(54) METHODS OF FORMING IMPURITY CONTAINING INSULATING FILMS AND FLASH MEMORY DEVICES INCLUDING THE SAME

(75) Inventors: Young-Jin Noh, Gyeonggi-do (KR);
Bon-Young Koo, Gyeonggi-do (KR);
Si-Young Choi, Gyeonggi-do (KR);
Ki-Hyun Hwang, Gyeonggi-do (KR);
Chul-Sung Kim, Gyeonggi-do (KR);
Sung-Kweon Baek, Gyeonggi-do (KR);
Jin-Hwa Heo, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 19 days.

(21) Appl. No.: 12/188,482

(22) Filed: Aug. 8, 2008

(65) Prior Publication Data

US 2009/0130834 A1 May 21, 2009

(51) Int. Cl.
*H01L 21/336* (2006.01)
(52) U.S. Cl. ........ 438/264; 438/392; 438/756; 438/775; 257/E21.267
(58) Field of Classification Search .................. 438/769, 438/264
See application file for complete search history.

(56) References Cited

U.S. PATENT DOCUMENTS

| | | | |
|---|---|---|---|
| 2003/0201491 A1* | 10/2003 | Chung | 257/324 |
| 2005/0003618 A1* | 1/2005 | Kanda | 438/275 |
| 2005/0006693 A1* | 1/2005 | Ngo et al. | 257/315 |
| 2005/0266637 A1* | 12/2005 | Wang | 438/257 |

FOREIGN PATENT DOCUMENTS

| | | |
|---|---|---|
| JP | 02-24612 | 10/1990 |
| JP | 2002353343 | 12/2002 |
| KR | 1020060057958 | 5/2006 |

* cited by examiner

*Primary Examiner* — Ajay K Arora
(74) *Attorney, Agent, or Firm* — Myers Bigel Sibley & Sajovec

(57) ABSTRACT

Methods of forming an insulating film include forming an insulating film on a substrate. A first impurity is injected into the insulating film using a thermal process under a first set of processing conditions to form a first impurity concentration peak in a lower portion of the insulating film. A second impurity is injected into the insulating film using the thermal process under a second set of processing conditions, different from the first set of processing conditions, to form a second impurity concentration peak in an upper portion of the insulating film. Injecting the first impurity and injecting the second impurity may be carried out without using plasma and the first impurity concentration peak may be higher than the second impurity concentration peak.

21 Claims, 12 Drawing Sheets

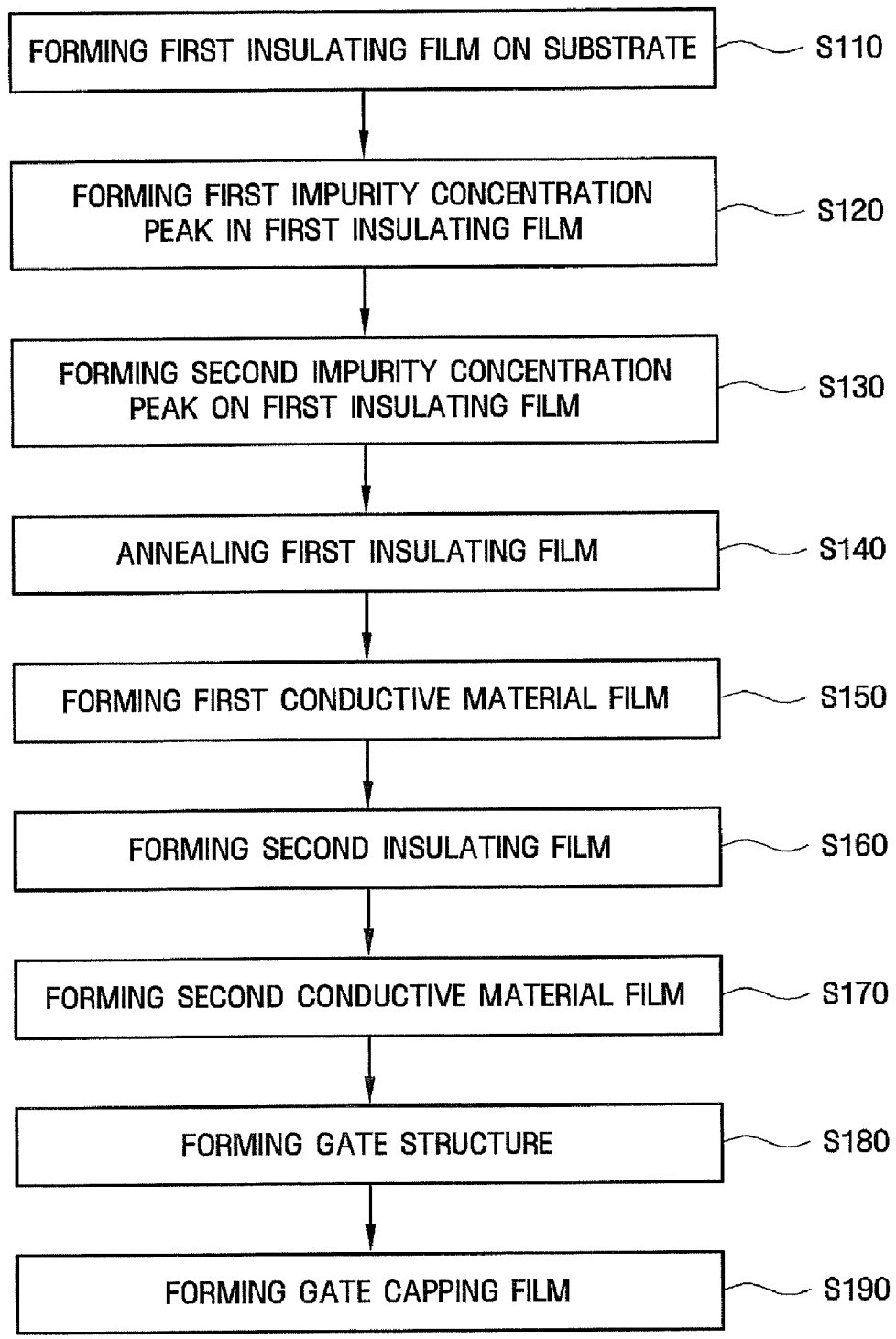

METHODS OF FORMING IMPURITY CONTAINING INSULATING FILMS AND FLASH MEMORY DEVICES INCLUDING THE SAME

CROSS-REFERENCE TO RELATED APPLICATION

This application is related to and claims priority under 35 USC §119 to Korean Patent Application No. 10-2007-0080273 filed on Aug. 9, 2007 in the Korean Intellectual Property Office, the disclosure of which is incorporated herein by reference in its entirety.

BACKGROUND OF THE INVENTION

The present invention relates to methods of forming an insulating film and methods of fabricating a flash memory device including the same, and more particularly to methods of forming an impurity-containing insulating film and methods of fabricating flash memory devices including such an insulating film.

One important characteristic of a flash memory device is the quality of its tunnel insulating film. This is because a flash memory generally stores or erases information by tunneling charges into a tunnel insulating film. This trait applies to both floating gate and charge trap type flash memory. A flash memory device generally uses an FN tunneling scheme when storing information. This FN tunneling scheme is a scheme for tunneling charges at a relatively high voltage, thereby typically ensuring stable tunneling. Indeed, it is important to ensure stable tunneling, but the FN tunneling scheme also may have a problem in that it is generally desired to lower a tunneling voltage as much as possible. In order to solve this problem, a study has been conducted to provide a method of lowering the energy band gap of a tunnel insulating film. Such a method is based on the fact that a voltage at which charges tunnel can be maintained lower when the energy band gap of a tunnel insulating film is lowered, and thus the stress burden of the tunnel insulating film is mitigated.

As a method of lowering the energy band gap of a tunnel insulating film, there has been proposed a method in which a tunnel insulating film is formed of a silicon oxy-nitride film. In particular, when a silicon oxy-nitride film containing high-concentration nitrogen is formed in upper and lower portions of the tunnel insulating film, there is a chance of lowering the energy band gap without significantly degrading the inherent properties of the tunnel insulating film.

In an effort to produce such results, methods have been proposed in which a tunnel insulating film is formed of a silicon oxy-nitride film by forming a silicon oxide film into which nitrogen is injected. Such technology corresponds to a method in which a tunnel insulating film is formed by a silicon oxide film on a semiconductor substrate, and then a silicon oxy-nitride film is partially formed using a plasma technique and/or a thermal reaction technique. A tunnel insulating film formed in this way has the possibility of improving FN tunneling characteristics as compared to a conventional tunnel insulating film made of only a silicon oxide film.

However, such silicon oxy-nitride film methods generally require different semiconductor fabrication equipment, which may result in a lack of continuity between the processes. Also, a problem of high process costs generally arises because the individual processes must typically be combined into one complete method. Moreover, this technology may be accompanied by surface damage due to a plasma process, and generally fails to closely control the concentration of nitrogen injected into a tunnel insulating film, so attainable characteristics may not be as good as expected.

SUMMARY OF THE INVENTION

Embodiments of the present invention include methods of forming an insulating film that include forming an insulating film on a substrate. A first impurity is injected into the insulating film using a thermal process under a first set of processing conditions to form a first impurity concentration peak in a lower portion of the insulating film. A second impurity is injected into the insulating film using the thermal process under a second set of processing conditions, different from the first set of processing conditions, to form a second impurity concentration peak in an upper portion of the insulating film. Injecting the first impurity and injecting the second impurity may be carried out without using plasma and the first impurity concentration peak may be higher than the second impurity concentration peak.

In other embodiments, the first impurity is nitrogen and the first impurity concentration peak is a first nitrogen concentration peak. Injecting the first impurity into the insulating film includes injecting the first impurity within a sealed chamber that is maintained at a temperature of about 900° C. to 1200° C. and a pressure of about 100 Torr to 760 Torr under an NO atmosphere without using plasma.

In further embodiments, the second impurity is nitrogen and the second impurity concentration peak is a second nitrogen concentration peak. Injecting the second impurity into the insulating film includes injecting the second impurity within a sealed chamber that is maintained at a temperature of about 900° C. to 1200° C. and a pressure of about 1 Torr to 200 Torr under an $NH_3$ atmosphere without using plasma. Injecting the second impurity may be followed by annealing the insulating film at a temperature of about 400° C. to 1200° C. under an oxygen-containing atmosphere without using plasma. Forming the insulating film, injecting the first impurity into the insulating film, injecting the second impurity into the insulating film, and annealing the insulating film may be conducted in situ in a same chamber of a semiconductor fabrication device.

In other embodiments, methods of fabricating a flash memory device include forming a first insulating film on a substrate. A first impurity concentration peak is formed in a lower portion of the first insulating film, proximate to the substrate, using a thermal process under a first set of processing conditions. A second impurity concentration peak is formed in an upper portion of the first insulating film, proximate to an upper surface of the first insulating film, using the thermal process under a second set of processing conditions, different from the first set of processing conditions. The first insulating film having the impurity concentration peaks therein is annealed. A first conductive material film is formed on the first insulating film. A second insulating film is formed on the first conductive material film. A second conductive material film is formed on the second insulating film. The first insulating film, the first conductive material film, the second insulating film, and the second conductive material film are patterned to form a gate structure. A capping film may be formed on the gate structure.

In yet other embodiments, methods of fabricating a flash memory device include forming a first insulating film on a substrate. A first impurity concentration peak is formed in a lower portion of the first insulating film, proximate the substrate, using a thermal process under a first set of processing conditions. A second impurity concentration peak is formed in an upper portion of the first insulating film, proximate to an upper surface of the first insulating film, using the thermal process under a second set of processing conditions, different from the first set of processing conditions. The first insulating film having the impurity concentration peaks therein is annealed. A second insulating film is formed on the first insulating film. A third insulating film is formed on the second insulating film. A conductive material film is formed on the third insulating film. The first insulating film, the second insulating film, the third insulating film, and the conductive material film are patterned to form a gate structure. A capping film may be formed on the gate structure.

In other embodiments, the first impurity concentration peak is a first nitrogen concentration peak. Forming the first impurity concentration peak in the lower portion of the first insulating film includes forming the first nitrogen concentration peak within a sealed chamber that is maintained at a temperature of about 900° C. to 1200° C. and a pressure of about 100 Torr to 760 Torr under an NO atmosphere without using plasma.

In further embodiments, the second impurity concentration peak is a second nitrogen concentration peak. Forming the second impurity concentration peak in the upper portion of the first insulating film includes forming the second nitrogen concentration peak within a sealed chamber that is maintained at a temperature of about 900° C. to 1200° C. and a pressure of about 1 Torr to 200 Torr under an $NH_3$ atmosphere without using plasma. Annealing the first insulating film may include annealing the first insulating film at a temperature of about 400° C. to 1200° C. under an oxygen-containing atmosphere without using plasma. The first insulating film may be a silicon oxide film and forming the first insulating film may include oxidizing a surface of the substrate using a radical oxidation method. Forming the first insulating film, forming the first impurity concentration peak in the lower portion of the first insulating film, forming the second impurity concentration peak in the upper portion of the first insulating film, and annealing the first insulating film may be conducted in situ in a same chamber of a semiconductor fabrication device.

BRIEF DESCRIPTION OF THE DRAWINGS

The above and other aspects, features and advantages of the present invention will be more apparent from the following detailed description taken in conjunction with the accompanying drawings, in which:

FIGS. 2A and 2B are flowcharts illustrating a method of fabricating a floating gate flash memory device and a method of fabricating a charge trap flash memory device in accordance with some embodiments of the present invention;

DETAILED DESCRIPTION OF EMBODIMENTS

Figure 1:
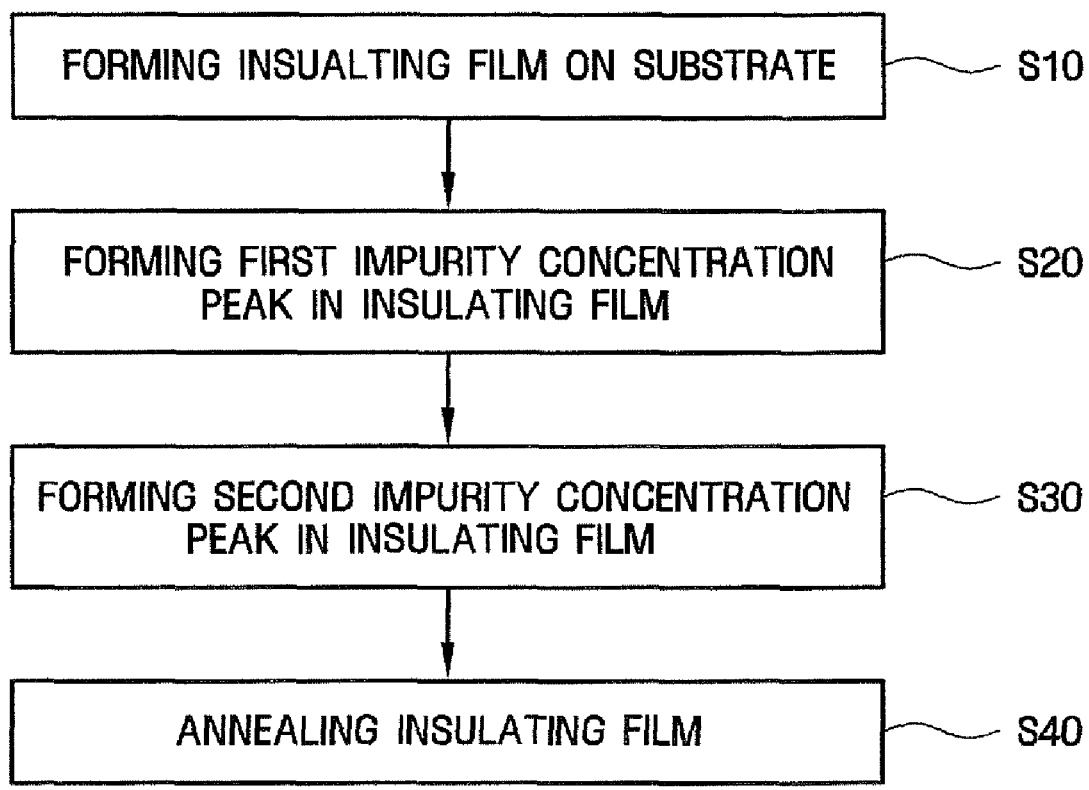
FIG. 1 is a flowchart illustrating a method of forming an insulating film in accordance with some embodiments of the present invention.

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

A method of forming an insulating film and a method of fabricating a flash memory device according to some embodiments of the present invention will now be described in detail with reference to the attached drawings. Initially, a method of forming an insulating film with two impurity concentration peaks will be described. FIG. 1 is a flowchart illustrating a method of forming an insulating film with two impurity concentration peaks according to some embodiments of the present invention.

Referring to FIG. 1, the method of forming an insulating film with two impurity concentration peaks includes forming an insulating film on a substrate (S10), injecting a first impurity into the insulating film to thereby form a first impurity concentration peak in a lower portion of the insulating film (S20), and injecting a second impurity into the insulating film to thereby form a second impurity concentration peak in an upper portion of the insulating film (S30). The method may further include annealing the insulating film (S40).

The substrate may be a substrate for semiconductor fabrication, for example, a silicon wafer. The insulating film may be an oxide film, for example, an oxide film formed by partially or wholly oxidizing a surface portion of the substrate. When the substrate is a silicon wafer, the insulating film may be a silicon dioxide film. However, other types of insulating films fall within the spirit of the present invention. That is, by oxidizing a surface of the substrate and at the same time injecting other impurities, the insulating film may be formed as an oxide film in which three or more kinds of materials are incorporated. An oxide film may be formed directly on the substrate. Examples of such an oxide film include various oxide-based films, such as a hafnium oxide film, an aluminum oxide film and/or the like.

In some embodiments, the insulating film may be formed by means of a thermal oxidation method, for example, a radical oxidation method. The radical oxidation method and other various methods of forming the insulating film will be described below.

The first impurity may be nitrogen. After the insulating film is formed, the first impurity may be injected so as to form a first peak (i.e., a region in which the concentration of the first impurity is relatively higher than those in other regions) in a portion close to the bottom surface of the insulating film. A first impurity injection process for forming the first peak may be a heat treatment process. The first impurity injection process may be a process in which the first impurity excited by thermal energy is injected a selected depth into the insulating film, and thermally diffuses to the lower portion of the insulating film.

By way of further explanation, forming the first peak may be considered a process in which the substrate formed with the insulating film is introduced into a reaction chamber, and then the insulating film on the substrate reacts with nitrogen under a nitrogen-containing atmosphere while heat is applied at a certain temperature. For example, a process may be used including setting the internal temperature of the reaction chamber to a temperature of about 800° C. to 1400° C. and maintaining an atmospheric pressure of about 100 Torr to 760 Torr while injecting NO gas to form the first peak. A more detailed description of this process will be given below.

The second impurity may also be nitrogen. The second impurity is injected into the insulating film to form a second peak (i.e., a region in which the concentration of the second impurity is relatively higher than those in other regions) in a portion closer to the top surface of the insulating film than the first peak. A second impurity injection process for forming the second peak may be similar to the first impurity injection process in that it may include a heat treatment process using thermal energy. However, in view of detailed conditions, the process of forming the second peak may be different from the process of forming the first peak. For example, a process of setting the internal temperature of the reaction chamber to a temperature of about 800° C. to 1400° C. and maintaining an atmospheric pressure of about 1 Torr to 200 Torr while injecting $NH_3$ gas may be used for forming the second peak. A more detailed description of this process will be given below.

As described above, an insulating film that has a first and/or a second material concentration peak in two portions thereof is formed. The first and second impurities may be the same or different, and each of these impurities may refer to an impurity combination in which two or more kinds of impurities are incorporated.

The insulating film with the impurities therein may be annealed in some embodiments of the present invention. The annealing process will be described below in detail.

In some embodiments, forming the first peak, forming the second peak and annealing are all performed as part of a heat treatment process. The first peak may have a higher value than the second peak. That is, the concentration of the first peak may be higher than that of the second peak. In some embodiments, the upper and lower portions refer to portions close to the insulating film surface and the substrate, respectively, with respect to a position corresponding to the half thickness (midpoint) of the insulating film. The insulating film may include heterogeneous impurity concentration peaks in its upper and lower portions, and may particularly exhibit electrically and physically stable properties when applied to a tunnel insulating film of a flash memory device and/or the like.

Figure 2B:
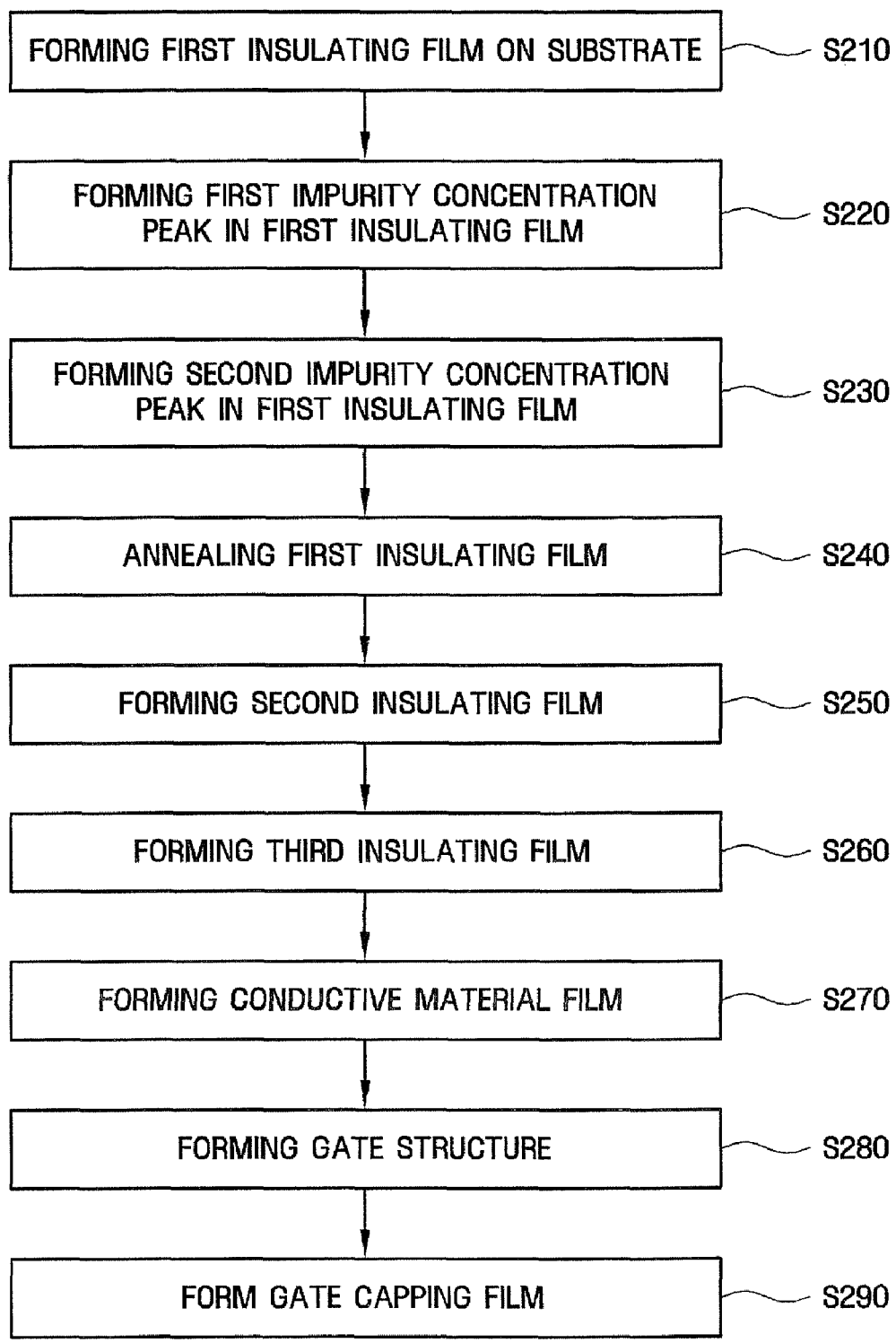

FIGS. 2A and 2B are flowcharts illustrating a method of fabricating a floating gate flash memory device and a method of fabricating a charge trap flash memory device according to some embodiments of the present invention. Referring to FIG. 2A, the method of fabricating a floating gate flash memory device according to some embodiments of the present invention includes forming a first insulating film on a substrate (S110), injecting a first impurity into the first insulating film to thereby form a first peak in a lower portion of the first insulating film (S120), injecting a second impurity into the first insulating film to thereby form a second peak in an upper portion of the first insulating film (S130), annealing the first insulating film (S140), forming a first conductive material film on the first insulating film (S150), forming a second insulating film on the first conductive material film (S160), forming a second conductive material film on the second insulating film (S170), patterning the first and second insulating films and the first and second conductive material films to thereby form a gate structure (S180), and forming a gate capping film on the gate structure (S1190).

Forming a first insulating film on a substrate (S110) includes forming an insulating film for use as a tunnel insulating film on a substrate for fabricating a flash memory device, for example, a silicon substrate. By way of example, a silicon oxide film is formed as the first insulating film by means of a radical oxidation method in some embodiments, but the present invention is not limited thereto. A detailed description thereof will be given below in conjunction with the relevant drawing.

When injecting a first impurity into the first insulating film to thereby form a first peak in a lower portion of the first insulating film (S120), the first impurity may be nitrogen or a nitrogen-containing impurity. That is, injecting a first impurity may include injecting nitrogen into the first insulating film to thereby form a first peak corresponding to relatively high nitrogen concentration in a lower portion of the first insulating film, proximate the substrate. A detailed description thereof will be given below in conjunction with the relevant drawing.

When injecting a second impurity into the first insulating film to thereby form a second peak in an upper portion of the first insulating film (S130), the second impurity may also be nitrogen or a nitrogen-containing impurity. That is, injecting the second impurity may include injecting nitrogen into the first insulating film to thereby form a second peak corresponding to high nitrogen concentration in an upper portion of the first insulating film, proximate to the first insulating film surface. A detailed description thereof will be given below in conjunction with the relevant drawing.

Annealing the first insulating film (S140) may include heat-treating the first insulating film to thereby recover possible defects generated while injecting the first and second impurities, and provide a more uniform atomic binding and distribution of the injected impurities. A detailed description thereof will be given below in conjunction with the relevant drawing.

Forming a first conductive material film on the first insulating film (S150) may include forming a conductive material film to be formed as a floating gate, such as a polycrystalline silicon film or the like, on the annealed first insulating film. A detailed description thereof will be given below in conjunction with the relevant drawing.

Forming a second insulating film on the first conductive material film (S160) may include forming an insulating film to be formed as a gate interlayer insulating film, on the first conductive material film. A detailed description thereof will be given below in conjunction with the relevant drawing.

Forming a second conductive material film on the second insulating film (S170) may include forming a conductive material film to be formed as a control gate, on the second insulating film. A detailed description thereof will be given below in conjunction with the relevant drawing.

Forming a gate structure (S180) may include performing a photolithography process for the first insulating film, the first conductive material film, the second insulating film and the second conductive material film formed in that order on the substrate, thereby forming a gate structure of a floating gate flash memory device. A detailed description thereof will be given below in conjunction with the relevant drawing.

Forming a gate capping film on the gate structure (S190) may include forming a third insulating film that covers the gate structure. A detailed description thereof will be given below in conjunction with the relevant drawing. Thereafter, the floating gate flash memory device according to some embodiments is fabricated by forming junctions, silicide films, via holes, interlayer insulating films and so forth.

FIG. 2B is a flowchart illustrating a method of fabricating a charge trap flash memory device according to some embodiments of the present invention. Referring to FIG. 2B, the method of fabricating a charge trap flash memory device according to some embodiments includes forming a first insulating film on a substrate (S210), injecting a first impurity into the first insulating film to thereby form a first peak in a lower portion of the first insulating film (S220), injecting a second impurity into the first insulating film to thereby form a second peak in an upper portion of the first insulating film (S230), annealing the first insulating film (S240), forming a second insulating film on the first insulating film (S250), forming a third insulating film on the second insulating film (S260), forming a conductive material film on the third insulating film (S270), forming a gate structure (S280), and forming a gate capping film on the gate structure (S290).

Forming a first insulating film on a substrate (S210) may include forming an insulating film for use as a tunnel insulating film on a substrate for fabricating a flash memory device, for example, a silicon substrate. By way of example, a silicon oxide film is formed as the first insulating film in some embodiments, but the present invention is not limited thereto. A detailed description thereof will be given below in conjunction with the relevant drawing.

When injecting a first impurity into the first insulating film to thereby form a first peak in a lower portion of the first insulating film (S220), the first impurity may be nitrogen or a nitrogen-containing impurity. That is, injecting a first impurity may include injecting nitrogen into the first insulating film to thereby form a first peak corresponding to relatively high nitrogen concentration in a lower portion of the first insulating film, proximate the substrate. A detailed description thereof will be given below in conjunction with the relevant drawing.

When injecting a second impurity into the first insulating film to thereby form a second peak in an upper portion of the first insulating film (S230), the second impurity may also be nitrogen or a nitrogen-containing impurity. That is, injecting the second impurity may include injecting nitrogen into the first insulating film to thereby form a second peak corresponding to high nitrogen concentration in an upper portion of the first insulating film, proximate the first insulating film surface. A detailed description thereof will be given below in conjunction with the relevant drawing.

Annealing the first insulating film (S240) may include heat-treating the first insulating film to thereby recover possible defects generated while injecting the first and second impurities, and provide a more uniform atomic binding and distribution of the injected impurities. A detailed description thereof will be given below in conjunction with the relevant drawing.

Forming a second insulating film (S250) may include forming an insulating film to be formed as a charge trap film, such as a silicon nitride film or the like, on the annealed first insulating film. A detailed description thereof will be given below in conjunction with the relevant drawing.

Forming a third insulating film (S260) may include forming an insulating film to be formed as a blocking film, on the second insulating film. A detailed description thereof will be given below in conjunction with the relevant drawing.

Forming a conductive material film (S270) may include forming a conductive material film to be formed as a gate electrode, on the third insulating film. A detailed description thereof will be given below in conjunction with the relevant drawing.

Forming a gate structure (S280) may include performing a photolithography process for the first insulating film, the second insulating film, the third insulating film and the conductive material film formed in that order on the substrate, thereby forming a gate structure of a charge trap flash memory device. A detailed description thereof will be given below in conjunction with the relevant drawing. Thereafter, the charge trap flash memory device according to the embodiments of FIG. 2B may be fabricated by forming junctions, silicide films, via holes, interlayer insulating films and so forth.

Reference will now be made to methods of fabricating flash memory devices according to some embodiments of the present invention, with reference to the attached drawings. FIGS. 3A to 3G illustrate sectional process views illustrating a method of forming a floating gate flash memory device 100 according to some embodiments of the present invention.

Figure 3A:
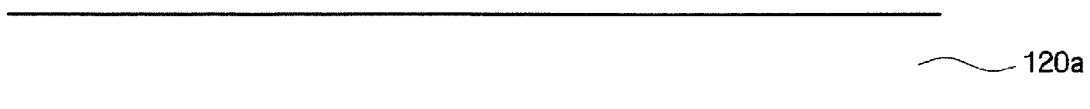
FIGS. 3A to 3G are cross-sectional views illustrating a method of fabricating a floating gate flash memory device in accordance with some embodiments of the present invention.

Referring to FIG. 3A, a first insulating film 120a is formed on a substrate 110 (corresponding to S110 in FIG. 2A). The substrate 110 may be a substrate 110 for fabricating a flash memory device, such as a silicon substrate, a silicon-germanium substrate, an SOI substrate, an SOS substrate and/or the like. By way of example, the first insulating film 120a will be described as formed by a silicon oxide film. However, the present invention should not be construed as limited thereto. In addition to the silicon oxide film, the first insulating film 120a may be various insulating films including a hafnium oxide film ($Hf_xO_y$), an aluminum oxide film ($Al_xO_y$), a zirconium oxide film ($Zr_xO_y$) and/or the like.

By way of example, the first insulating film 120a is described as formed by oxidizing a surface portion of the substrate 110. The first insulating film 120a may be formed, for example, by oxidizing a surface portion of the substrate 110 using plasma, using thermal energy, and/or otherwise. As described herein, the first insulating film 120a is formed using thermal energy.

A method of forming the first insulating film 120a by using thermal energy may include a wet oxidation method using water vapor ($H_2O$ gas), a dry oxidation method using oxygen ($O_2$ gas), and/or a radical oxidation method using oxygen radical (O*). In particular embodiments, the first insulating film 120a is formed by means of the radical oxidation method.

While the first insulating film 120a may be formed by diffusing and infiltrating oxygen atoms into the substrate 110 in the wet and dry oxidation methods, the first insulating film 120a is formed by forming high reactive oxygen radicals on/in the substrate 110 in the radical oxidation method. When compared to an insulating film formed by other methods, an insulating film formed by the radical oxidation method is generally relatively rapidly formed because the oxygen radical has a good reactivity, is uniform in composition, and is stable because a little dangling bond is present at an interface. However, the present invention should not be construed as limited to the radical oxidation method.

The first insulating film 120a may be formed by other methods. However, as described herein, forming the first insulating film by the radical oxidation method may be conducted at a temperature of about 800° C. to 1200° C. under an atmospheric pressure of about several Torr to several tens of Torr in RTP (Rapidly Thermal Process) equipment. In some embodiments, the first insulating film 120a may be formed with the thickness of about 10 nm. Forming the first insulating film 120a may be carried out without using plasma.

Figure 3B:
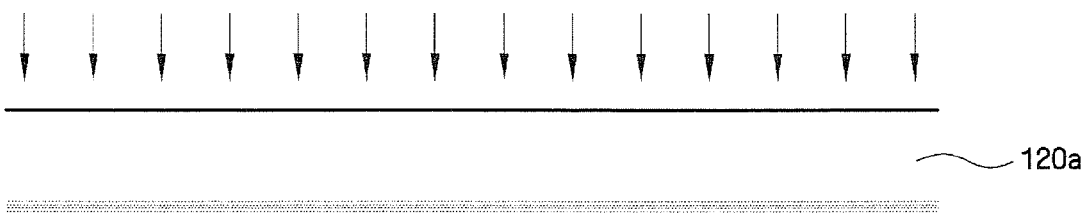

Referring to FIG. 3B, nitrogen concentration is increased in a lower portion of the first insulating film 120a, adjacent to the boundary surface between the substrate 110 and the first insulating film 120a, by injecting nitrogen into the lower portion of the first insulating film 120a (corresponding to S120 in FIG. 2A). In this nitrogen injection operation, nitrogen may be injected into the substrate 110. It will be understood that it is difficult for nitrogen to be injected into the substrate 110 made of single crystal silicon, and even if nitrogen is injected, there is little empty space that may be occupied by nitrogen, due to the generally good bonding state of the substrate 110. That is, nitrogen injection into the substrate 110 is expected to be sufficiently negligible.

Injecting nitrogen into the lower portion of the first insulating film 120a may be conducted by applying heat to the first insulating film 120a within a chamber of heat treatment process equipment, which is sealed under an NO atmosphere, while maintaining a relatively high pressure. More specially, if nitrogen is injected into the first insulating film 120a, nitrogen generally diffuses to the lower portion of the first insulating film 120a, proximate and/or adjacent to the substrate 110. The reason for this may be found in the fact that the majority of spaces or points in or at which nitrogen atoms may be located or bonded are generally distributed in the lower portion of the first insulating film 120a, proximate to the substrate 110.

Nitrogen atoms that diffuse to the lower portion of the first insulating film 120a can substitute Si—O bonds or Si—H bonds that are abnormal due to dangling bonds, stresses and so forth. In conclusion, the first insulating film 120a is partially formed into a silicon oxy-nitride film or is changed to a silicon oxide film containing nitrogen.

In some embodiments, the meaning of maintaining a relatively high pressure within the sealed chamber is to maintain the interior of the chamber at an atmospheric pressure higher than those to be used in subsequent steps.

In some embodiments, injecting nitrogen into the lower portion of the first insulating film 120a includes injecting nitrogen with an internal temperature of the chamber of about 900° C. to 1200° C., and an internal pressure of the chamber of about 100 Torr to 760 Torr. By way of example, the injection step may be conducted at a temperature of about 1000° C. and a pressure of 200 Torr within the chamber.

Also, by way of example, nitrogen is injected such that a maximum nitrogen concentration of about 7.5 atom % can be partially maintained in the lower portion. However, this is only one example embodiment of the present invention. The concentration of nitrogen to be injected may vary according to design rules of flash memory devices, process equipment characteristics and the like.

Injecting nitrogen into the lower portion of the first insulating film 120a, may be conducted in-situ in one and the same high-speed heat treatment process equipment as in the preceding step (the step of forming the first insulating film 120a). This is because, in view of process conditions, both operations may use thermal energy, and thus similar temperature conditions can be advantageously set for them Injecting nitrogen into the lower portion of the first insulating film 120a may be conducted without using plasma.

Figure 3C:
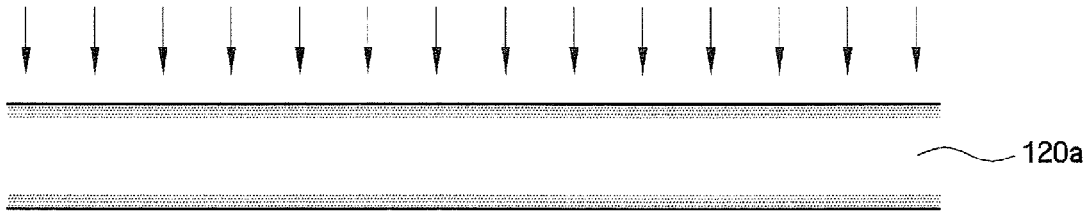

Referring to FIG. 3C, nitrogen concentration is increased in an upper portion of the first insulating film 120a, adjacent to the surface of the first insulating film 120a, by injecting nitrogen into the upper portion of the first insulating film 120a (corresponding to S130 in FIG. 2A).

In specific embodiments, injecting nitrogen into the upper portion of the first insulating film 120a may be conducted by applying heat to the first insulating film 120a within a chamber of heat treatment process equipment, which is sealed under an $NH_3$ atmosphere, while maintaining a relatively low pressure. If nitrogen is injected into the first insulating film 120a, nitrogen generally does not diffuse deep into the first insulating film 120a, but is distributed in the vicinity of the surface. The reason for this may be found in the fact that process conditions under which nitrogen atoms can diffuse deep into the first insulating film 120a are not provided. That is, the atmospheric pressure within the sealed chamber is maintained at a relatively low pressure. This means that the interior of the chamber is maintained at an atmospheric pressure lower than those applied in the preceding operations.

When the first insulating film 120a formed in this way is used as a tunnel insulating film of a flash memory device, nitrogen injected into an upper portion of the tunnel insulating film, that is, a portion adjacent to the tunnel insulating film surface, may suppress the punch-through phenomenon and enhance the dielectric constant of the tunnel insulating film during tunneling of charges. As a program/eraser voltage may be reduced, resistance to FN tunneling may also be enhanced. Further, other impurities including phosphorous (P) and hydrogen (H) may be limited or even prevented from penetrating the tunnel insulating film.

When injecting nitrogen into the upper portion of the first insulating film 120a, the internal temperature of the chamber may be about 900° C. to 1200° C., and the internal pressure of the chamber may be about 10 Torr to 100 Torr. By way of example, the injection may be conducted at a temperature of about 1000° C. and a pressure of 50 Torr within the chamber.

Also, by way of example, nitrogen may be injected such that a maximum nitrogen concentration of about 5 atom % can be partially maintained in the upper portion. However, this is only one example of embodiments of the present invention. The concentration of nitrogen to be injected may vary according to design rules of flash memory devices, process equipment characteristics and the like.

Injecting nitrogen into the upper portion of the first insulating film 120a may be conducted in-situ in one and the same high-speed heat treatment process equipment as in the preceding operations (forming the first insulating film 120a and injecting nitrogen into the lower portion of the first insulating film 120a). This is because, in view of process conditions, these three steps may all use thermal energy, and thus similar temperature conditions can be advantageously set for them. The step of injecting nitrogen into the upper portion of the first insulating film 120a may be conducted without using plasma.

Figure 3D:
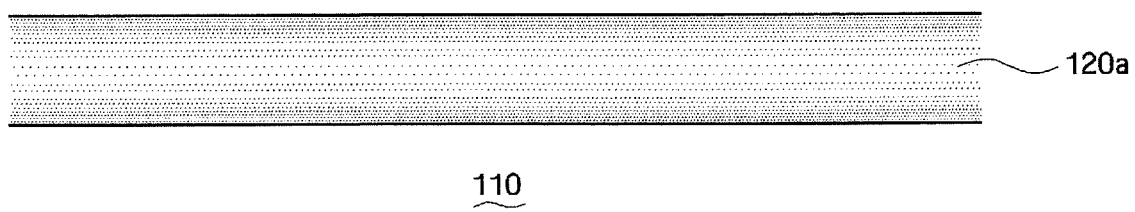

Referring to FIG. 3D, the first insulating film 120a is subjected to heat treatment (corresponding to S140 in FIG. 2A). The first insulating film 120a may obtain a stable distribution of nitrogen and stable atomic bonding during the heat treatment process.

A nitrogen concentration profile may vary. To illustrate a variation in the nitrogen concentration profile, various hatching patterns are shown in the first insulating film 120a of FIG. 3D. It will be understood that the higher the density of dots, the higher the nitrogen concentration.

Heat treating may be carried out at an internal temperature between about 400° C. and 1200° C. within a sealed chamber of heat treatment process equipment. By way of example, a pressure of 100 Torr may be maintained within the sealed chamber. An atmosphere containing $O_2$ and/or HCl gas may be used with different types of heat treatment processes (wet/dry oxidation process, oxygen radical oxidation process, oxygen-containing plasma process, thermal process under atmosphere containing $O_2$ and HCl gases and/or the like). By way of example, a radical oxidation process may be carried out under an oxygen atmosphere. However, this is only for the purpose of illustration, and the present invention is not limited thereto. In other terminologies, this heat treatment may be referred to as a secondary oxidation step.

Heat-treating the insulating film 120a into which nitrogen is injected, may also be conducted in-situ in one and the same high-speed heat treatment process equipment as in the preceding operations (forming the insulating film 120a, injecting nitrogen into the lower portion of the insulating film 120a, adjacent to the substrate 110, and injecting nitrogen into the upper portion of the insulating film 120a, adjacent to the surface of the insulating film 120a). As they are all heat treating operations, there may be substantially little difference in process temperature among these operations. Heat-treating the first insulating film 120a may be carried out without using plasma.

Heat treating as described above may be replaced by an oxidation step. For example, any of various oxidation processes may be used, including a wet oxidation process, dry oxidation process, radical oxidation process, plasma oxidation process, $O_2$+HCl oxidation process or the like. In particular, processes other than the plasma oxidation process may be conducted in some embodiments, the reason for which is that the operations may, thus, be conducted in situ in one and the same chamber. However, since plasma does little damage to the surface of a workpiece in a heat treatment step, it is possible to include the plasma oxidation process in this operation.

Figure 3E:

Referring to FIG. 3E, a first conductive material film 130a, a second insulating film 140a and a second conductive material film 150a are formed in that order on the first insulating film 120a (corresponding to S150 to S170 in FIG. 2A). The first conductive material film 130a may be formed of polycrystalline silicon. Herein, an ion injection process for providing the first conductive material film 130a with conductivity may not be used. The first conductive material film 130a may be used as a floating gate in a floating gate flash memory device.

The second insulating film 140a may be formed of a silicon oxide film and/or a silicon nitride film. The second insulating film 140a may be used as a gate interlayer insulating film in a floating gate flash memory device.

In some embodiments, the second insulating film 140a may be formed as a multilayer film. When the second insulating film 140a is formed as a multilayer film, it may be generally formed in the form of so-called ONO (Oxide/Nitride/Oxide).

The second conductive material film 150a may be formed of polycrystalline silicon. Herein, an ion injection process for providing the second conductive material film 150a with conductivity may not be used. That is, the second conductive material film 150a may be formed of ion-injected polycrystalline silicon so as to have conductivity. An ion to be injected is usually selected from among Group-2 elements in the periodic table, and in particular, phosphorous (P) and/or arsenic (As) may be injected. The second conductive material film 150a may be used as a control gate in a floating gate flash memory device.

To improve the conductivity of the second conductive material film 150a, a metal, metal silicide, a metal compound, a metal alloy and the like may be included in the second conductive material film 150a. For example, the second conductive material film 150a may be formed of a single metal, may be formed of a silicon layer on which a metal silicide layer resulting from the reaction of silicon with a metal is formed, may be formed of a silicon layer on/under which a metal compound, such as TiN, WN, TaN, etc., is formed, and/or may be formed of a silicon layer on/under which a layer made of two or more metal alloys is formed.

Figure 3F:
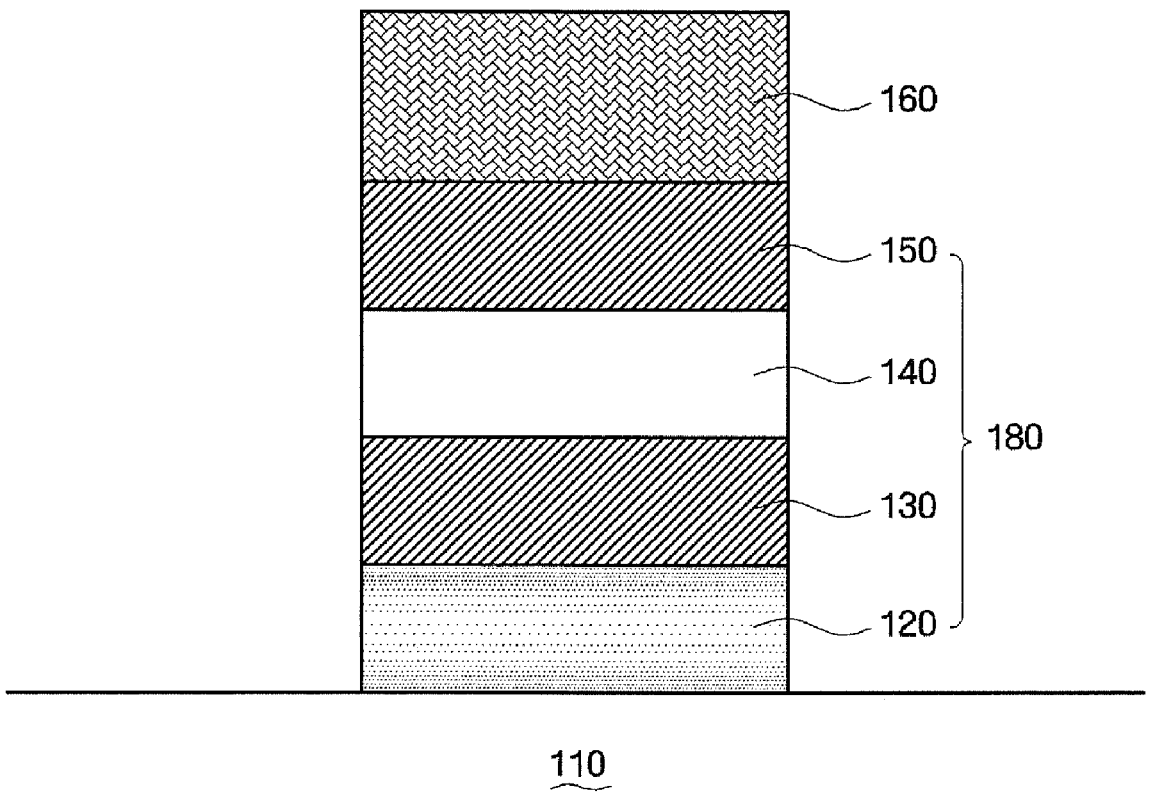

Referring to FIG. 3F, a mask pattern 160 is formed, and the second conductive material film 150a, the second insulating film 140a, the first conductive material film 130a and the first insulating film 120a are patterned using the mask pattern 160 as a patterning mask. In this way, a gate structure 180 is formed (corresponding to S180 in FIG. 2A).

The illustrated gate structure 180 includes a tunnel insulating film 120, a floating gate 130, a gate interlayer insulating film 140 and a control gate 150. The tunnel insulating film 120 is formed by patterning the first insulating film 120a, the floating gate 130 is formed by patterning the first conductive material film 130a, the gate interlayer insulating film 140 is formed by patterning the second insulating film 140a, and the control gate 150 is formed by patterning the second conductive material film 150a.

The mask pattern 160 may be a photoresist pattern and/or a hard mask pattern. When the mask pattern 160 is a hard mask pattern, it may be formed by a combination of one or more of a silicon oxide film, a silicon nitride film and a silicon oxy-nitride film.

Figure 3G:
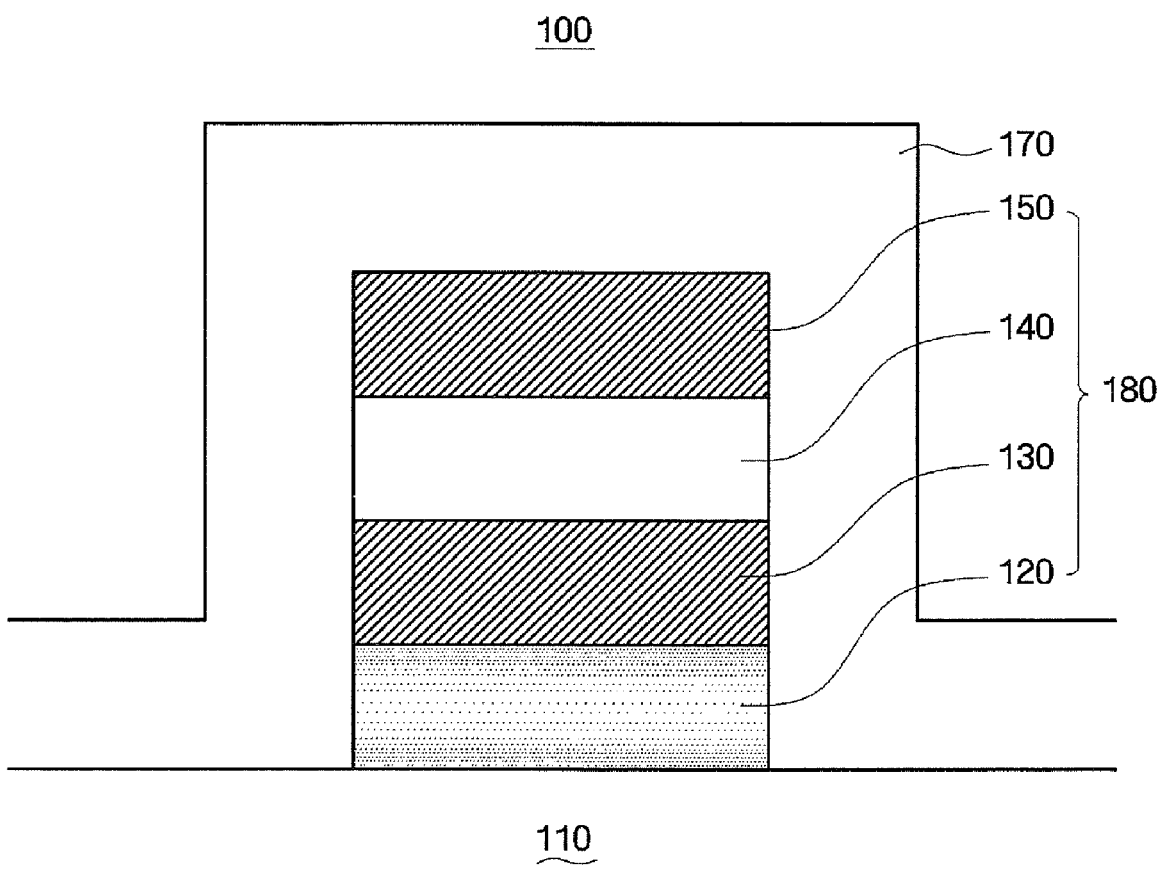

Referring to FIG. 3G, the mask pattern 160 is removed, and a gate capping film 170 covering the gate structure 180 is formed (corresponding to S190 in FIG. 2A). The gate capping film 170 may be formed, for example, by a silicon oxide film, a silicon nitride film and/or a silicon oxy-nitride film. By way of example, the gate capping film 170 may be formed of a silicon oxide film. As seen from the drawing, the gate capping film 170 may be formed in such a manner as to completely fill spaces between the films of the adjacent gate structure 180. Thereafter, the floating gate flash memory device 100 according to some embodiments may be fabricated by forming junctions, silicide films, via holes, interlayer insulating films and so forth on portions of the substrate 110.

In the fabrication method of the floating gate flash memory device 100, illustrated in FIGS. 3A to 3G, the gate structure 180 has been described by exemplifying its constituent elements. Thus, various changes and modifications may be made to the gate structure 180 in order to implement the purpose and function of each constituent element. For example, each of the tunnel insulating film 120 and the gate interlayer insulating film 140 may be formed as a multilayer insulating film, each of the floating gate 130 and the control gate 150 may be formed by a multilayer film so as to include a metal or metal silicide, or any other material film may be interposed between the respective constituent elements. As such, the present invention should not be construed as limited to the particular embodiments described above.

Figure 4A:
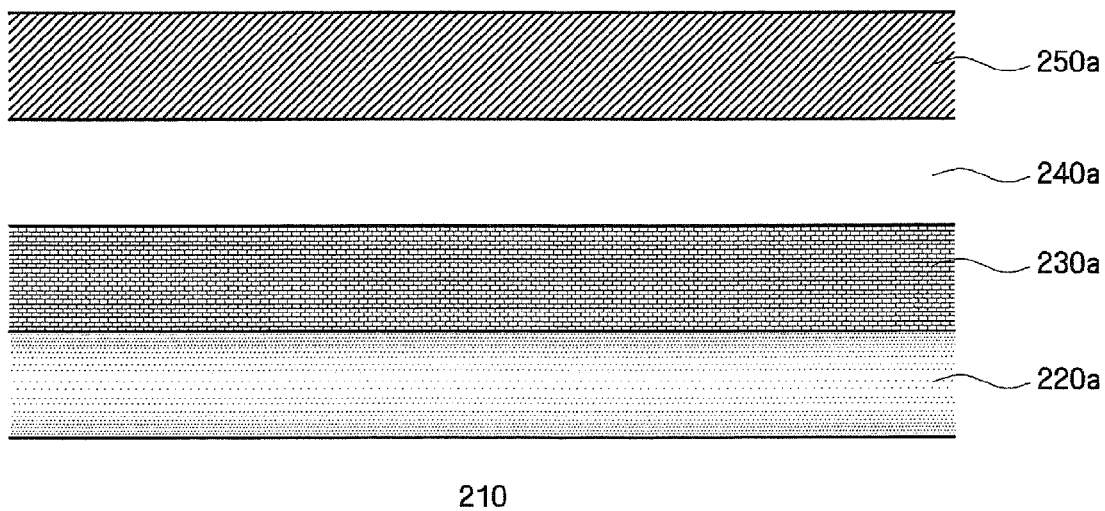
FIGS. 4A to 4C are cross-sectional views illustrating a method of fabricating a charge trap flash memory device in accordance with some embodiments of the present invention.
Figure 4B:
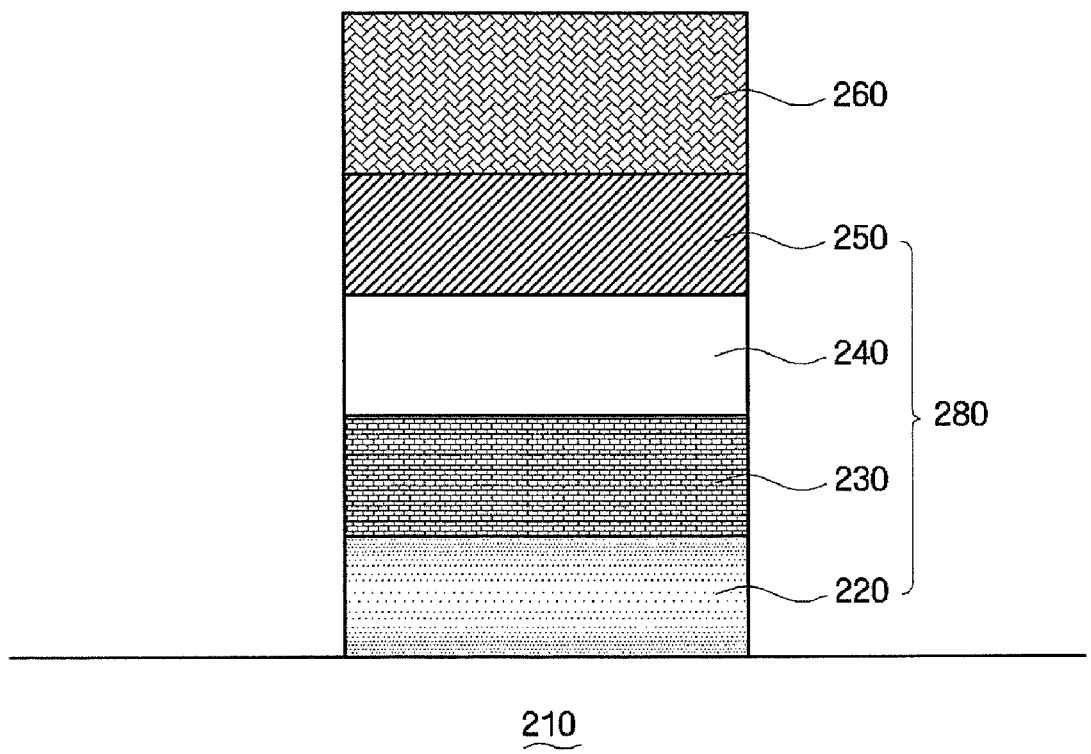
Figure 4C:
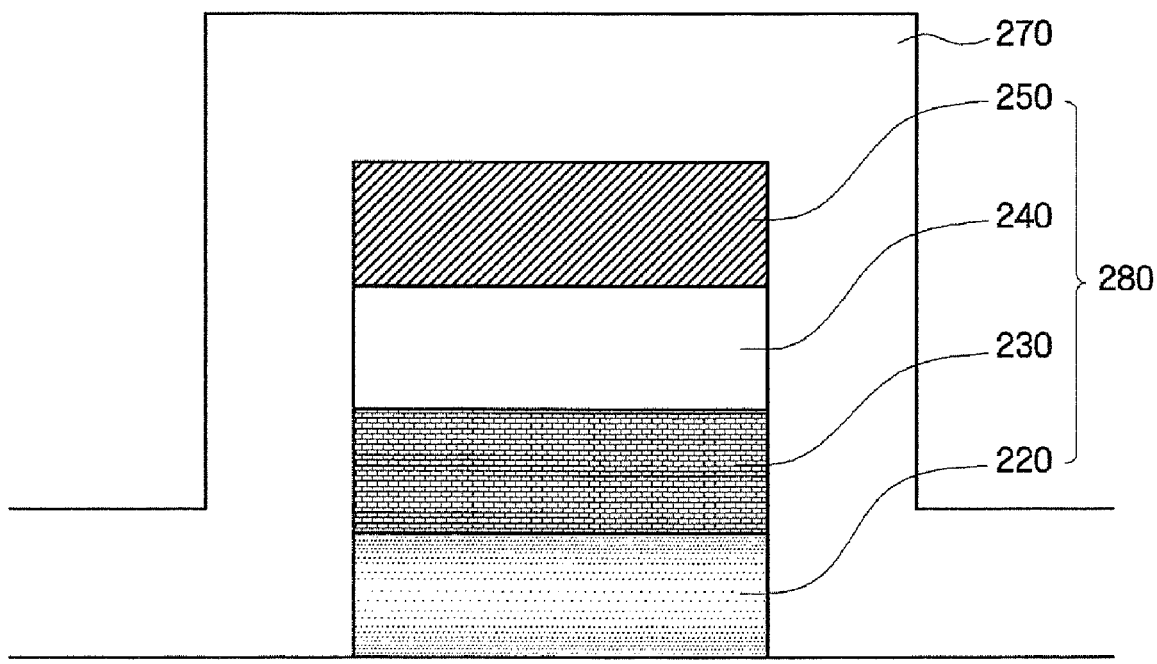

FIGS. 4A to 4C illustrate flowcharts illustrating a method of fabricating a charge trap flash memory device 200 according to some embodiments of the present invention. The following description will be easily understood when read in connection with FIG. 2B.

Operations such as those described with reference to FIGS. 3A to 3D may be conducted before the operations to be described with reference to FIGS. 4A to 4C (corresponding to S210 to S240 in FIG. 2B). Referring to FIG. 4A, a second insulating film 230a, a third insulating film 240a and a conductive material film 250a are formed on a first insulating film 220a (corresponding to S250 to S270 in FIG. 2B).

The second insulating film may be formed of a silicon nitride film. Also, the second insulating film 230a may be used as a charge trap film in a charge trap flash memory device.

The third insulating film 240a may be formed of a silicon oxide film, an aluminum oxide film, or other high dielectric insulating films containing lanthanum, and/or the like. The third insulating film 240a may also be formed by an ONO film. The third insulating film 240a may be used as a blocking film in a charge trap flash memory device. In addition, as the third insulating film 240a is generally formed as a multilayer insulating film including two or more layers, it should be appreciated that, while the third insulating film 240a is illustrated as a single layer film in the drawing, a multilayer insulating film as the third insulating film 240a also falls within the scope of the present invention.

The conductive material film 250a may be formed of polycrystalline silicon. Herein, an ion injection process for providing the conductive material film 250a with conductivity may not be needed. That is, the conductive material film 250a may be formed of ion-injected polycrystalline silicon so as to have conductivity. An ion to be injected is usually selected from among Group V elements in the periodic table, and in particular, phosphorous (P) and/or arsenic (As) may be injected. The conductive material film 250a may be used as a gate electrode in a charge trap flash memory device.

In order to improve the conductivity of the conductive material film 250a, a metal, metal silicide, a metal compound, a metal alloy and/or the like may be included in the conductive material film 250a. For example, the conductive material film 250a may be formed of a single metal, may be formed by a silicon layer on which a metal silicide layer resulting from the reaction of silicon with a metal is formed, may be formed by a silicon layer on/under which a metal compound, such as TiN, WN, TaN, etc., is formed, or may be formed by a silicon layer on/under which a layer made of two or more metal alloys is formed.

Referring to FIG. 4B, a mask pattern 260 is formed, and the conductive material film 250a, the third insulating film 240a, the second insulating film 230a and the first insulating film 220a are patterned using the mask pattern 260 as a patterning mask. In this way, a gate structure 280 is formed (corresponding to S280 in FIG. 2B). The illustrated gate structure 280 includes a tunnel insulating film 220, a charge trap film 230, a blocking film 240 and a gate electrode 250. The tunnel insulating film 220 is formed by patterning the first insulating film 220a, the charge trap film 230 is formed by patterning the second insulating film 230a, the blocking film 240 is formed by patterning the third insulating film 240a, and the gate electrode 250 is formed by patterning the conductive material film 250a. The mask pattern 260 may also be a photoresist pattern and/or a hard mask pattern.

Referring to FIG. 4C, the mask pattern 260 is removed, and a gate capping film 270 covering the gate structure 280 is formed (corresponding to S290 in FIG. 2B). The gate capping film 270 may be formed of a silicon oxide film, a silicon nitride film and/or a silicon oxy-nitride film. By way of example, the gate capping film 270 may be formed of a silicon oxide film. As seen from the drawing, the gate capping film 270 may be formed in such a manner as to completely fill spaces between the films of the gate structure 280. Thereafter, the charge trap flash memory device 200 according to some embodiments may be fabricated by forming junctions, silicide films, via holes, interlayer insulating films and so forth on portions of the substrate 210, which are not shown in the drawing.

In the fabrication method of the charge trap flash memory device 200, illustrated in FIGS. 3A to 3D and 4A to 4D, the gate structure 280 has been described by reference to some of its constituent elements. Various changes and modifications may be made to the gate structure 280 in order to implement the purpose and function of each constituent element. For example, the tunnel insulating film 220 may be formed as a multilayer insulating film, the gate electrode 250 may be formed by a multilayer film so as to include a metal or metal silicide, or any other material film may be interposed between the respective constituent elements. For example, in the case of a charge trap flash memory device called TANOS, the gate electrode 250 may include a tantalum nitride film (TaN), and the blocking film 240 may include an aluminum oxide film. Thus, the present invention should not be limited to the particular embodiments described herein.

Figure 5:
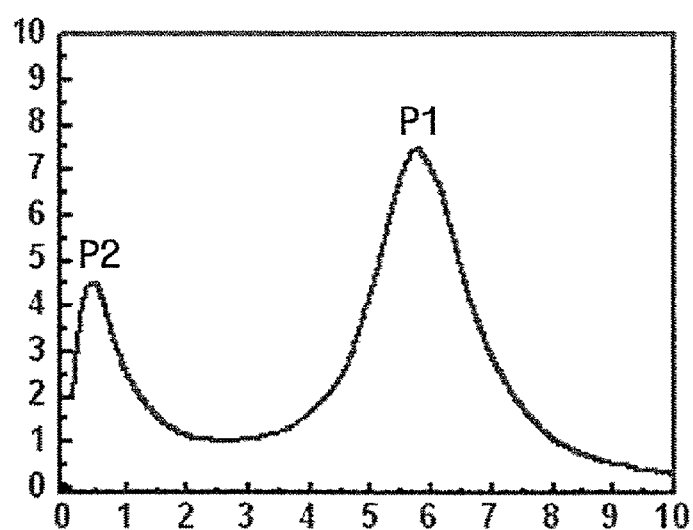
FIG. 5 is a graph illustrating a nitrogen concentration profile of a tunnel insulating film illustrating characteristics of a tunnel insulating film of a flash memory device in accordance with some embodiments of the present invention.

FIG. 5 illustrates the nitrogen concentration profile of a tunnel insulating film of a flash memory device according to some embodiments of the present invention, based on which characteristics of the tunnel insulating film will be described in more detail. The abscissa axis (X-axis) represents the depth (in nm) in a direction from the surface of the tunnel insulating film to a substrate, and the ordinate axis (Y-axis) represents the concentration (in atom %) of nitrogen contained in the tunnel insulating film. By way of example, the thickness of the tunnel insulating film is about 10 nm or more.

Referring to FIG. 5, the tunnel insulating film of a flash memory device according to the illustrated embodiments shows a first peak P1 of about 7.5 atom % in a position close to the substrate, and shows a second peak P2 of about 5 atom % in a position close to the surface. More specially, the nitrogen concentration of the tunnel insulating film shows the first peak P1 at a depth of about 6 nm from the upper surface of the insulating film, and shows the second peak P2 at a depth of about 0.5 nm from the surface. As can be seen from the drawing, the first peak P1 is higher than the second peak P2. This is because a relatively higher nitrogen concentration is formed in a position proximate to the substrate in order to make the most of effects to be obtained by injecting nitrogen into the tunnel insulating film. A minimum nitrogen concentration over the entire tunnel insulating film is shown as about 1 atom %.

When nitrogen is injected into the tunnel insulating film in some embodiments, two concentration peaks are formed in two positions adjacent to the substrate and the surface of the tunnel insulating film, respectively. However, if too much nitrogen is injected into the tunnel insulating film, the characteristic of electron tunneling into the tunnel insulating film may deteriorate. Also, the information-preserving characteristic of the flash memory device may be lowered. In some embodiments, improvements can be expected if the peak value of nitrogen concentration is adjusted to about 5 atom %, and adverse effects may not not reach a serious level if the peak value is adjusted to 10 atom % or less.

Various tests of embodiments of the present invention show that a high atmospheric pressure with a process chamber is effective to form a nitrogen concentration peak in the first peak position, that is, a position adjacent to the substrate, and a low atmospheric pressure within a process chamber is effective to form a nitrogen concentration peak in the second peak position, that is, a position adjacent to the surface of the tunnel insulating film. Thus, in some embodiments of the present invention, a process of forming the first peak is conducted separately from a process of forming the second peak in order to precisely form the respective peaks.

Figure 6:
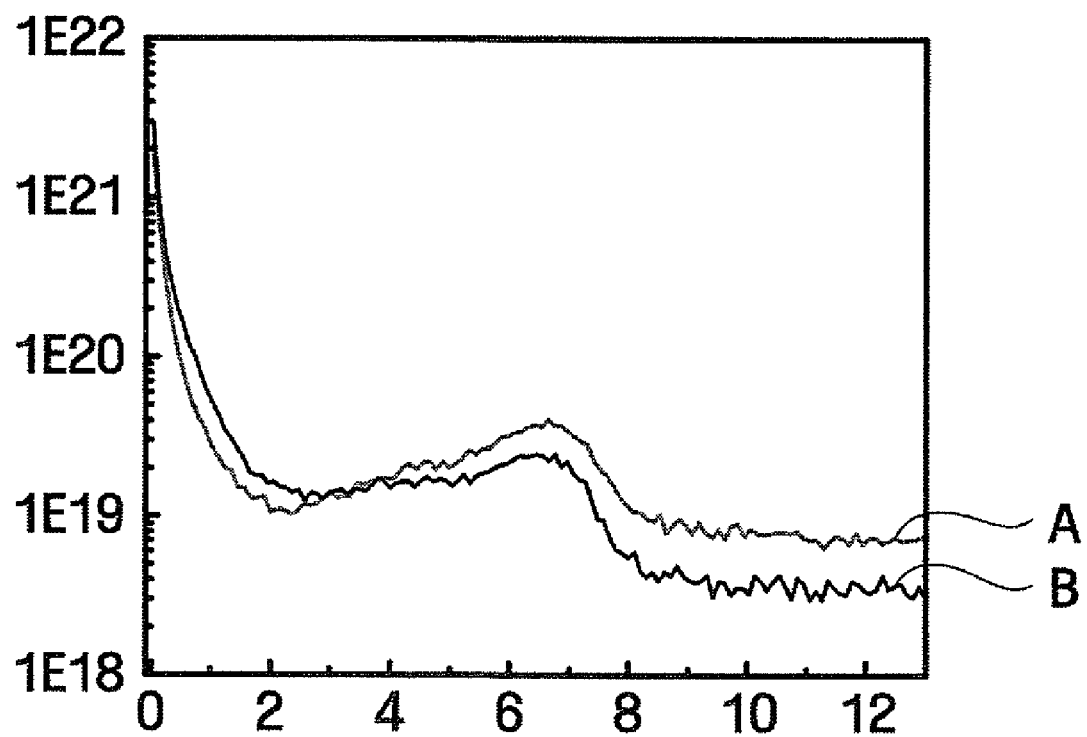
FIG. 6 is a graph illustrating a hydrogen concentration profile of a tunnel insulating film formed using a method of forming a tunnel insulating film of a flash memory device in accordance with some embodiments of the present invention.

FIG. 6 illustrates the hydrogen concentration profile of a tunnel insulating film that is formed using a method of forming a tunnel insulating film of a flash memory device according to some embodiments of the present invention. The abscissa axis (X-axis) represents the depth (in nm) in a direction from the surface of the tunnel insulating film to a substrate, and the ordinate axis (Y-axis) represents the concentration (in atom %) of hydrogen contained in the tunnel insulating film. By way of example, the thickness of the tunnel insulating film is about 10 nm or more. Curve A corresponds to a case where nitrogen is injected into the tunnel insulating film by using plasma, and curve B corresponds to a case where nitrogen is injected into the tunnel insulating film by means of a thermal reaction without using plasma.

Referring to FIG. 6, for both the case where nitrogen is injected into the tunnel insulating film by using plasma (curve A) and the case where nitrogen is injected into the tunnel insulating film by using a thermal reaction (curve B), the concentration of hydrogen becomes lower toward a position adjacent to the substrate. However, curve B shows a decrease in hydrogen concentration to a greater extent than curve A. It is known that when hydrogen concentration at the interface between the substrate and the tunnel insulating film is high, Si—H bonds may disadvantageously deteriorate various characteristics of a tunnel insulating film of a flash memory device. However, as the tunnel insulating film formed according to some embodiments of the present invention shows very low hydrogen concentration near the interface between the substrate and the tunnel insulating film, the characteristics of the tunnel insulating film can be improved.

Also, the tunnel insulating film according to some embodiments shows better durability and lower phased change over the tunnel insulating film into which nitrogen is injected using plasma. Better durability means that the tunnel insulating film generally cannot be ruptured, and low phase change means that a variation in a hydrogen or nitrogen content is generally very small. In other words, it means that initial characteristics of the tunnel insulating film may be maintained well for a long time.

Figure 7:
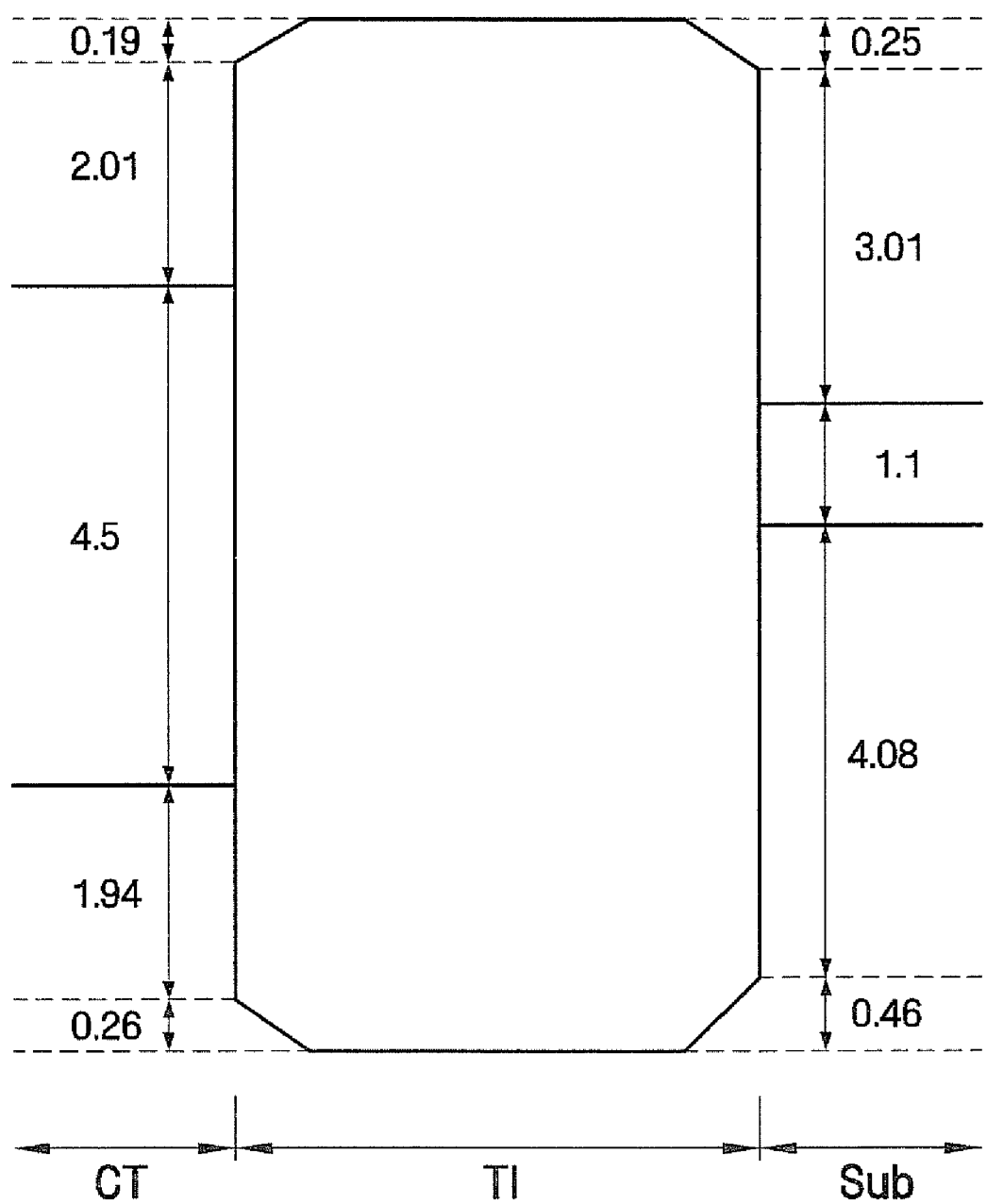
FIG. 7 is an energy band diagram of a tunnel insulating film formed in accordance with some embodiments of the present invention.

FIG. 7 illustrates an energy band diagram of a tunnel insulating film formed according to some embodiments of the present invention. In particular, FIG. 7 illustrates an energy band diagram of a tunnel insulating film of a charge trap flash memory device. A charge trap film CT, a tunnel insulating film TI and a substrate Sub are plotted in the X-direction, and a barrier energy level in eV (electron volt) is plotted in the Y-direction.

Referring to FIG. 7, the energy band gap of the tunnel insulating film TI is about 8.9 eV. However, it can be noted that the energy band gap is reduced to about 8.10 eV in a position close to the substrate Sub and is reduced to 8.45 eV in a position close to the surface (i.e., the charge trap film CT) when nitrogen is injected into the tunnel insulating film. Of course, the overall energy band gap is also slightly reduced.

More particularly, in a position close to the substrate Sub, the electron band offset is improved by about 0.25 eV, and the hole band offset is improved by about 0.46 eV. Also, in a position close to the charge trap film CT, the electron band offset is improved by about 0.19 eV, and the hole band offset is improved by about 0.26 eV.

A decrease in the energy band gap means that the speed characteristic of program/erase in a flash memory device may be improved. This may also be adjusted in various ways according to how much nitrogen is injected.

In some embodiments of the present invention, it may be empirically proven that, when an appropriate amount of nitrogen is injected into a tunnel insulating film of a flash memory device, punch through is suppressed during charge tunneling, and a program/erase voltage is reduced as compared to a tunnel insulating film into which no nitrogen is injected, so that the tunnel insulating film may have improved durability to a tunneling stress, and impurities may be limited or even prevented from penetrating into the tunnel insulating film due to the stabilization of internal dangling bonds.

Further, in some embodiments it may be empirically proven that a stable on/off switching operation is carried out and no leakage current occurs in a read operation state.

An advantage of the method of forming a tunnel insulating film of a flash memory device according to some embodiments of the present invention is its ability to be performed using one and the same semiconductor fabrication process equipment. That is, as the method can be performed only using heat treatment process equipment without need for use of plasma process equipment, a tunnel insulating film of a flash memory device according to some embodiments of the present invention may be formed using only one heat treatment process equipment. Also, some embodiments of the present invention include thermal processes that have similar or almost similar temperature conditions among their respective process conditions, and therefore all the process can be conducted in situ in one and the same reaction chamber.

As semiconductor fabrication process equipment may be very expensive, the price of the semiconductor equipment may be the largest share of the production cost of a semiconductor device. If a nitrogen injection process is conducted using plasma, very expensive plasma process equipment is generally needed, which may result in an increase in the production cost of a flash memory device. Accordingly, in some embodiments of the present invention, a tunnel insulating film of a flash memory device is formed using only one semiconductor process equipment, so that an effect of lowering the production cost of the flash memory device can be attained. Also, in a semiconductor fabrication method in which processes are performed with different equipment, process flows may be very complex, and thus process parameters also increase. In contrast with this, according to some embodiments of the present invention, process stability is significantly improved by applying simple and easy processes.

As described above, a method of forming fabricating a flash memory device according to some embodiments of the present invention can physically suffer little damage, and can be physically and electrically stable because any plasma process may be excluded. Also, a series of processes for forming all tunnel insulating films can be conducted in situ by using only one semiconductor fabrication equipment as each process may be carried out in one and the same reaction chamber. Accordingly, flash memory devices according to some embodiments of the present invention may have high reliability and production yield, and additionally their production costs may be reduced.

Thus, some embodiments of the present invention may provide a method of fabricating a flash memory device, which is not accompanied by surface damage because of no use of any plasma process, can closely control the concentration of nitrogen injected into a tunnel insulating film on a region-by-region basis, and is carried out in one and the same chamber, thereby providing stable fabrication processes and reducing production costs.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of forming an insulating film, the method comprising:
    forming an insulating film on a substrate;
    injecting a first impurity into the insulating film using a thermal process under a first set of processing conditions to form a first impurity concentration peak in a lower portion of the insulating film; and
    injecting a second impurity into the insulating film using the thermal process under a second set of processing conditions, different from the first set of processing conditions, to form a second impurity concentration peak in an upper portion of the insulating film, so that the lower portion of the insulating film and the upper portion of the insulating film have their own maximum impurity concentration values, respectively;
    wherein the lower portion of the insulating film comprises regions above and below a first region where the first impurity concentration peak occurs that have impurity concentrations less than the first impurity concentration peak, and wherein the upper portion of the insulating film comprises regions above and below a second region where the second impurity concentration peak occurs that have impurity concentrations less than the second impurity concentration peak.

2. The method of claim 1, wherein forming the insulating film includes oxidizing a surface of the substrate using a radical oxidation method.

3. The method of claim 1, wherein injecting the first impurity and injecting the second impurity are carried out without using plasma and wherein the first impurity concentration peak is higher than the second impurity concentration peak.

4. The method of claim 3, wherein the first impurity comprises nitrogen and the first impurity concentration peak comprises a first nitrogen concentration peak and wherein injecting the first impurity into the insulating film includes injecting the first impurity within a sealed chamber that is maintained at a temperature of about 900° C. to 1200° C. and a pressure of about 100 Torr to 760 Torr under an NO atmosphere.

5. The method of claim 4, wherein the second impurity comprises nitrogen and the second impurity concentration peak comprises a second nitrogen concentration peak and wherein injecting the second impurity into the insulating film includes injecting the second impurity within a sealed chamber that is maintained at a temperature of about 900° C. to 1200° C. and a pressure of about 1 Torr to 200 Torr under an $NH_3$ atmosphere.

6. The method of claim 5, wherein injecting the second impurity is followed by annealing the insulating film at a temperature of about 400° C. to 1200° C. under an oxygen-containing atmosphere without using plasma.

7. The method of claim 6, wherein forming the insulating film, injecting the first impurity into the insulating film, injecting the second impurity into the insulating film, and annealing the insulating film are conducted in situ in a same chamber of a semiconductor fabrication device.

8. A method of fabricating a flash memory device, the method comprising:
forming a first insulating film on a substrate;
forming a first impurity concentration peak in a lower portion of the first insulating film, proximate to the substrate, using a thermal process under a first set of processing conditions;
forming a second impurity concentration peak in an upper portion of the first insulating film, proximate to an upper surface of the first insulating film, using the thermal process under a second set of processing conditions, different from the first set of processing conditions, so that the lower portion of the first insulating film and the upper portion of the first insulating film have their own maximum impurity concentration values, respectively, wherein the lower portion of the first insulating film comprises regions above and below a first region where the first impurity concentration peak occurs that have impurity concentrations less than the first impurity concentration peak, and wherein the upper portion of the first insulating film comprises regions above and below a second region where the second impurity concentration peak occurs that have impurity concentrations less than the second impurity concentration peak;
annealing the first insulating film having the impurity concentration peaks therein;
forming a first conductive material film on the first insulating film;
forming a second insulating film on the first conductive material film;
forming a second conductive material film on the second insulating film; and
patterning the first insulating film, the first conductive material film, the second insulating film, and the second conductive material film to form a gate structure.

9. The method of claim 8, wherein patterning first insulating film, the first conductive material film, the second insulating film, and the second conductive material film is followed by forming a capping film on the gate structure.

10. The method of claim 9, wherein the first insulating film comprises a silicon oxide film and wherein forming the first insulating film comprises oxidizing a surface of the substrate using a radical oxidation method.

11. The method of claim 9, wherein the first impurity concentration peak comprises a first nitrogen concentration peak and wherein forming the first impurity concentration peak in the lower portion of the first insulating film includes forming the first nitrogen concentration peak within a sealed chamber that is maintained at a temperature of about 900° C. to 1200° C. and a pressure of about 100 Torr to 760 Torr under an NO atmosphere without using plasma.

12. The method of claim 11, wherein the second impurity concentration peak comprises a second nitrogen concentration peak and wherein forming the second impurity concentration peak in the upper portion of the first insulating film includes forming the second nitrogen concentration peak within a sealed chamber that is maintained at a temperature of about 900° C. to 1200° C. and a pressure of about 1 Torr to 200 Torr under an $NH_3$ atmosphere without using plasma.

13. The method of claim 12, wherein annealing the first insulating film comprises annealing the first insulating film at a temperature of about 400° C. to 1200° C. under an oxygen-containing atmosphere without using plasma.

14. The method of claim 13, wherein forming the first insulating film, forming the first impurity concentration peak in the lower portion of the first insulating film, forming the second impurity concentration peak in the upper portion of the first insulating film, and annealing the first insulating film are conducted in situ in a same chamber of a semiconductor fabrication device.

15. A method of fabricating a flash memory device, the method comprising:
forming a first insulating film on a substrate;
forming a first impurity concentration peak in a lower portion of the first insulating film, proximate the substrate, using a thermal process under a first set of processing conditions;
forming a second impurity concentration peak in an upper portion of the first insulating film, proximate to an upper surface of the first insulating film, using the thermal process under a second set of processing conditions, different from the first set of processing conditions, so that the lower portion of the first insulating film and the upper portion of the first insulating film have their own maximum impurity concentration values, respectively, wherein the lower portion of the first insulating film comprises regions above and below a first region where the first impurity concentration peak occurs that have impurity concentrations less than the first impurity concentration peak, and wherein the upper portion of the first insulating film comprises regions above and below a second region where the second impurity concentration peak occurs that have impurity concentrations less than the second impurity concentration peak;
annealing the first insulating film having the impurity concentration peaks therein;
forming a second insulating film on the first insulating film;
forming a third insulating film on the second insulating film;
forming a conductive material film on the third insulating film; and
patterning the first insulating film, the second insulating film, the third insulating film, and the conductive material film to form a gate structure.

16. The method of claim 15, wherein patterning the first insulating film, the second insulating film, the third insulating film, and the conductive material film is followed by forming a capping film on the gate structure.

17. The method of claim 16, wherein the first insulating film comprises a silicon oxide film and wherein forming the first insulating film comprises oxidizing a surface of the substrate using a radical oxidation method.

18. The method of claim 16, wherein the first impurity concentration peak comprises a first nitrogen concentration peak and wherein forming the first impurity concentration peak in the lower portion of the first insulating film includes forming the first nitrogen concentration peak within a sealed chamber that is maintained at a temperature of about 900° C. to 1200° C. and a pressure of about 100 Torr to 760 Torr under an NO atmosphere without using plasma.

19. The method of claim 18, wherein the second impurity concentration peak comprises a second nitrogen concentration peak and wherein forming the second impurity concentration peak in the upper portion of the first insulating film includes forming the second nitrogen concentration peak within a sealed chamber that is maintained at a temperature of about 900° C. to 1200° C. and a pressure of about 1 Torr to 200 Torr under an $NH_3$ atmosphere without using plasma.

20. The method of claim 19, wherein annealing the first insulating film comprises annealing the first insulating film at a temperature of about 400° C. to 1200° C. under an oxygen-containing atmosphere without using plasma.

21. The method of claim 20, wherein forming the first insulating film, forming the first impurity concentration peak in the lower portion of the first insulating film, forming the second impurity concentration peak in the upper portion of the first insulating film, and annealing the first insulating film are conducted in situ in a same chamber of a semiconductor fabrication device.

* * * * *